United States Patent [19]

Hwail et al.

[11] Patent Number: 6,048,576
[45] Date of Patent: Apr. 11, 2000

[54] METHOD OF PRODUCING ADHESIVE TAPE FOR ELECTRONIC PARTS

[75] Inventors: Jin Hwail, Kyongki-Do; Ihm Dae Woo, Seoul; Chi Sung Dae, Kyongki-Do, all of Rep. of Korea

[73] Assignee: Saehan Industries Incorporation, Kyongsangbuk-Do, Rep. of Korea

[21] Appl. No.: 09/252,162

[22] Filed: Feb. 16, 1999

[51] Int. Cl.$^7$ ...................................................... B05D 5/10
[52] U.S. Cl. ......................... 427/208; 427/209; 427/386; 427/387; 427/407.1
[58] Field of Search .................................... 427/208, 209, 427/386, 387, 407.1

*Primary Examiner*—Bernard Pianalto
*Attorney, Agent, or Firm*—Harrison & Egbert

[57] ABSTRACT

A method of producing an adhesive tape which can bond electronic parts at the environs of a lead frame, such as leads, diepads and radiant plates, semiconductor chips, to each other and which is superior in adhesiveness, thermal resistance and electrical properties. The adhesive tape is produced by coating on one side or both sides of a thermally resistant film an adhesive composition comprising a carboxylic group-containing acrylonitrile-butadiene copolymer ranging, in weight average molecular weight, from 5,000 to 10,000 with an acrylonitrile content of 5–50 weight %, a mixed epoxy resin selected from a set of bisphenol A-type epoxy and cresol novolak epoxy and a set of bisphenol A-type epoxy and phenol novolak epoxy, a compound having at least two intramolecular maleimide groups, an aromatic diamine compound, an epoxy-containing liquid silicon resin, a filler and a solvent and drying it.

7 Claims, No Drawings

METHOD OF PRODUCING ADHESIVE TAPE FOR ELECTRONIC PARTS

BACKGROUND OF THE INVENTION

1. Field of the Invention

The present invention relates to a method of producing an adhesive tape with which electronic parts at the environs of a lead frame, such as leads, diepads and radiant plates, semiconductor chips, are bonded to each other.

2. Description of the Prior Art

Conventional adhesive tapes used for resin package semiconductor devices may be exemplified by lead frame-fixing adhesive tapes, adhesive tapes for radiant plates, and TAB carrier tapes. As for a lead frame-fixing adhesive tape, it is used to fix a lead of a lead frame, with the aim of enhancing the production yield and productivity for the lead frame itself as well as in the whole semiconductor assembly process. Generally, the adhesive tapes are applied on lead frames by lead frame makers and these are used to mount semiconductor chips which are then packaged in a resin by semiconductor assemblers. In connection with these works, the adhesive tapes for fixing lead frames are required to be superior in the reliability, the workability upon taping and the adhesiveness after work as well as to show thermal resistance sufficient to overcome the heating in the assembly process of semiconductor devices.

Examples of the conventional adhesive tapes for these purposes include those in which polyacrylonitrile, polyacrylate or an acrylonitrile-butadiene copolymer alone or in combination with thermosetting resins is coated on thermal resistant support films, such as polyimide films. Recently, the package structures of semiconductor devices have become complex owing to the requirement for multi-pin structure and heat radiation in the semiconductor devices and the organic materials used in the adhesive tapes have been strictly required to be good in electrical, physical and thermal properties and in handling. Conventional adhesive tapes are, however, insufficient in thermal properties, dimensional stability and electrical properties. Particularly, when lead pins are bonded to heat sinks or connected to semiconductor chips through conventional insulating tapes, there is a serious problem in that the metallic materials, such as lead frames, might be bent or damaged.

To solve the problems, U.S. Pat. Nos. 5,494,757 and 5,500,294 disclose liquid adhesives comprising a piperazinylethylaminocarbonyl-containing butadiene-acrylonitrile copolymer and a compound having at least two maleimide groups optionally in combination with a diamine-containing polysiloxane compound. These liquid adhesives can be adhered and cured at a relatively low temperature and have sufficient heat resistance and electrical properties, but have a significant problem of generating a large quantity of out gas.

SUMMARY OF THE INVENTION

It is an object of the present invention to overcome the problems encountered in the prior art and to provide a method for producing an adhesive tape for electronic parts, which can be adhered and cured at relatively low temperatures and is superior in thermal resistance, electrical properties and out gas generation.

In accordance with the present invention, the above object is accomplished by a provision of a method for producing an adhesive tape, in which an adhesive composition comprising a carboxylic group-containing acrylonitrile-butadiene copolymer ranging, in weight average molecular weight, from 5,000 to 10,000 with an acrylonitrile content of 5–50 weight %, a mixed epoxy resin selected from a set of bisphenol A-type epoxy and cresol novolak epoxy and a set of bisphenol A-type epoxy and phenol novolak epoxy, a compound having at least two intramolecular maleimide groups, an aromatic diamine compound, an epoxy-containing liquid silicon resin, a filler and a solvent, is coated on one side or both sides of a thermal resistant film and dried.

DETAILED DESCRIPTION OF THE INVENTION

The present invention pertains to an adhesive composition comprising an acrylonitrile-butadiene copolymer (component A), a mixed epoxy resin (component B), a bismaleimide compound (component C), an aromatic diamine compound (component D), a liquid silicon resin (component E) and a filler (component F) in a solution.

The acrylonitrile-butadiene copolymer (component A) useful in the present invention ranges, in weight average molecular weight, from approximately 5,000 to 200,000 with an acrylonitrile content of 5–50 wt % and a carboxyl equivalent of approximately 500–10,000. For example, if the weight average molecular weight is below 5,000, the resulting adhesive composition is poor in thermal stability, adhesiveness and thermal resistance. On the other hand, if the weight average molecular weight is over 200,000, poor solubility results, so that the solution is too viscous to be handled with ease. Less than 5 wt % of the acrylonitrile content deleteriously affects the thermal resistance and chemical resistance while, when the acrylonitrile is present at an amount of more than 50 wt %, insufficient thermal resistance is obtained. When the carboxyl equivalent is greater than 10,000, a problem occurs in the adhesiveness and the thermal resistance of the composition. On the other hand, the carboxyl equivalent smaller than 500 lowers the stability in a solution state so that the workability of the solution becomes poor.

As for the mixed epoxy resin (component B) used in the present invention, it is obtained from a mixture of a bisphenol A-type epoxy and a cresol novolak epoxy or a mixture of a bisphenol A-type epoxy and a phenol novolak epoxy. Based on 100 weight parts of the component A, the bisphenol A-type epoxy is added at an amount of 20–500 weight parts and preferably 80–200 weight parts and the cresol novolak epoxy or phenol novolak epoxy is added at an amount of 10–200 weight parts and preferably 40–100 weight parts. If the bisphenol A-type epoxy is present at an amount of less than 20 weight parts, the resulting composition shows poor adhesiveness. On the other hand, if too much bisphenol A-type epoxy is used, low thermal resistance is given. Less than 10 weight parts of the cresol novolak epoxy or phenol novolak epoxy bring debasement into the thermal resistance of the composition. An excessive amount of the cresol novolak epoxy or phenol novolak epoxy produces a problem in adhesiveness.

The bismaleimide resin (component C) useful in the present invention is a compound having at least two intramolecular maleimide groups, as represented by the following chemical formula I or II:

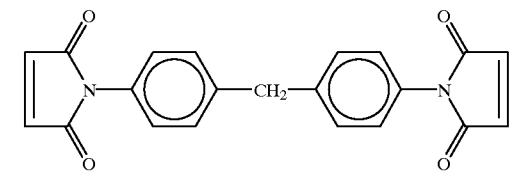

[I]

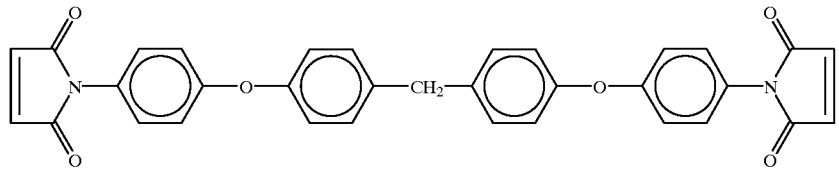

[II]

It is preferably used at an amount of approximately 10–200 weight parts based on 100 weight parts of the component A. For example, less than 10 weight parts of the component C cause deterioration in thermal resistance, modulus of elasticity after curing, and mechanical strength while too excessive amounts of the component C reduce the adhesiveness of the composition.

The aromatic diamine compound (component D) is preferably used at an amount of approximately 1–100 weight parts based on 100 weight parts of the sum of the component B and the component C. Excess or insufficient amounts of the component D cause a problem in solvent resistance, thermal resistance and electric resistance. In the present invention, it is recommended that aromatic diamine compounds superior in electrical properties, thermal resistance and chemical resistance are used. A curing agent may be used to promote a curing reaction.

The liquid silicon resin (component E) has epoxy groups. The silicon moiety plays an important role in providing a chemical association within the adhesive, so that it is improved in thermal resistance, water logging tolerance and electric insulation, which leads to an increase in the durability and reliability of the adhesive tape. The component E is used at an amount of approximately 0.1–20 weight parts based on 100 weight parts of the component B. For example, less than 0.1 weight parts of the component E can not be expected to show an improvement in such functions. On the other hand, addition of more than 20 weight parts results in a decrease in adhesiveness.

The filler (component F) used in the present invention may be inorganic particles or organic particles. It is preferably used at an amount of approximately 1–50 weight parts based on 100 weight parts of the component A. For example, less than 0.1 weight parts of the filler makes the adhesive composition too adhesive to handle with ease, reducing the mechanical strength and elastic module of the adhesive. On the other hand, more than 50 weight parts cause a problem in adhesiveness. As an inorganic filler, zinc oxide, silica, alumina or zirconia powder may be used. Examples of the organic filler include powered acryl resins, polyamide resins and silicon.

The above components A to F are dissolved in a solvent so as to give a viscosity of 100–2,000 cps and preferably 300–1,000 cps.

On a thermally resistant film, the composition thus obtained is coated at such an amount that it remains 10–50 μm thick after drying. After being dried at 80–120° C. for 1–20 min, the composition on the backing film is applied by a release film and subjected to general processes for adhesive tapes in which semi-curing is carried out at 80–120° C. for 5–30 min, to give a thermally resistant adhesive tape for electronic parts.

The thermally resistant film available in the present invention may be prepared from a thermal resin, such as polyimide, polyphenylene sulfide, polyethylene terephthalate and polyethylene naphthalate. It is preferably approximately 5–100 μm thick and more preferably approximately 25–150 μm thick.

Examples of such a release film include polypropylene films, fluoro resin films, polyethylene films, polyethylene terephthalate films and paper. These films, if necessary, may be provided with more releasability by applying silicon resins thereto.

A better understanding of the present invention may be obtained in the light of the following examples which are set forth to illustrate, but are not to be construed to limit the present invention.

EXAMPLE I 100 weight parts of an acrylonitrile-butadiene copolymer having a weight average molecular weight of 20,000 with a carboxyl equivalent of 1,200 and an acrylonitrile content of 40 wt %, were dissolved in methylethyl ketone to give a solution with a solid content of 15 wt %. To this solution were added 100 weight parts of bisphenol A-type epoxy (with an epoxy equivalent of 100), 50 weight parts of cresol novolak epoxy (with an epoxy equivalent of 200), 25 weight parts of N', N'-(4,4'-diphenylmethane)bismaleimide, 25 weight parts of diaminodiphenyl methane, 2 weight parts of a liquid silicon resin containing epoxy groups, and 6 weight parts of zinc oxide with an average particle size of 2.0 μm, followed by addition of methylethyl ketone and toluene to give an adhesive solution ranging, in viscosity, from 800 to 1,000 cps.

On a polyimide film 50 μm thick, such as that sold by DuPont under the brand name of "KAPTON", the adhesive solution was applied thickly enough to allow the coating to be 20 μm thick after drying. After drying at 120° C. for 5 min, a polyethylene terephthalate film 38 μm trick was laminated on the coating to afford an adhesive tape.

EXAMPLE II 100 weight parts of an acrylonitrile-butadiene copolymer having a weight average molecular weight of 100,000 with a carboxyl equivalent of 2,700 and an acrylonitrile content of 27 wt %, 200 weight parts of bisphenol A-type epoxy (with an epoxy equivalent of 400), 100 weight parts of cresol novolak epoxy (with an epoxy equivalent of 200), 50 weight parts of N', N'-(4,4'-diphenylmethane)bismaleimide, 50 weight parts of diaminodiphenyl methane, 2 weight parts of a liquid silicon resin containing epoxy groups, and 6 weight parts of zinc oxide with an average particle size of 2.0 μm were mixed with each other and dissolved in methylethyl ketone and toluene to give an adhesive solution ranging, in viscosity, from 800 to 1,000 cps. Using this adhesive composition, an adhesive tape was made in the same manner as that of Example I.

EXAMPLE III 100 weight parts of an acrylonitrile-butadiene copolymer having a weight average molecular weight of 100,000 with a carboxyl equivalent of 2,300 and an acrylonitrile content of 32 wt %, 200 weight parts of bisphenol A-type epoxy (with an epoxy equivalent of 400), 100 weight parts of phenol novolak epoxy (with an epoxy equivalent of 400), 50 weight parts of N', N'-(4,4'-diphenylmethane)bismaleimide, 50 weight parts of diaminodiphenyl methane, 2 weight parts of a liquid silicon resin containing epoxy groups, and 6 weight parts of zinc oxide with an average particle size of 2.0 μm were mixed with each other and dissolved in methylethyl ketone and toluene to give an adhesive solution ranging, in viscosity, from 800 to 1,000 cps. Using this adhesive composition, an adhesive tape was made in the same manner as that of Example I.

COMPARATIVE EXAMPLE I 100 weight parts of an acrylonitrile-butadiene copolymer having a weight average molecular weight of 100,000 with a carboxyl equivalent of 2,300 and an acrylonitrile content of 32 wt %, 300 weight parts of bisphenol A-type epoxy (with an epoxy equivalent of 400), 50 weight parts of diaminodiphenyl methane, 2 weight parts of a liquid silicon resin containing epoxy groups, and 6 weight parts of zinc oxide with an average particle size of 2.0 μm were mixed with each other and dissolved in methylethyl ketone and toluene to give an adhesive solution ranging, in viscosity, from 800 to 1,000 cps. Using this adhesive composition, an adhesive tape was made in the same manner as that of Example I.

COMPARATIVE EXAMPLE II 100 weight parts of an acrylonitrile-butadiene copolymer having a weight average molecular weight of 150,000 with an acrylonitrile content of 32 wt %, 200 weight parts of bisphenol A-type epoxy (with an epoxy equivalent of 400), 100 weight parts of cresol novolak epoxy (with an epoxy equivalent of 200), 50 weight parts of N,N'-(4,4'-diphenylmethane)bismaleimide, 50 weight parts of diaminodiphenyl methane, 2 weight parts of a liquid silicon resin containing epoxy groups, and 6 weight parts of zinc oxide with an average particle size of 2.0 μm were mixed with each other and dissolved in methylethyl ketone and toluene to give an adhesive solution ranging, in viscosity, from 800 to 1,000 cps. Using this adhesive composition, an adhesive tape was made in the same manner as that of Example I.

The adhesive tapes obtained in Examples and Comparative Examples were tested for various properties in the following manners and the test results are shown in Table 1, below.

Adhesiveness

A thin copper piece was put on a heat plate maintained at 150° C. and then, pressurized thereon at a pressure of 5 kg/cm$^2$ for 0.5 sec by use of the tapes. After being dried at 175° C. for 1 hour in a hot blast oven, the tapes were measured for T-PEEL strength by a tensile strength tester.

Pyrolytic Temperature

Using a thermal gravity analyzer (DuPont V4, IC 2200), the temperatures at which the tapes lost 5% of their weights were measured.

Out gas

After being stored at 170° C. for 1 hour in a drier, the tapes were measured for the change in their weights.

Hygroscopic percentage

After being immersed in water at 23° C. for 1 hour, the tapes were measured for the change in their weights.

Modulus of Elasticity

After being dried for 1 hour at 170° C. and additionally for 1 hour at 250° C., the tapes were measured for modulus of elasticity by use of a tensile strength tester.

TABLE 1

| Tapes | Adhesiveness (g/cm) | Pyrolytic Temp. (° C.) | Out Gas (%) | Hygros. Percent (%) | Elast. Modulus (kg/mm$^2$) |
|---|---|---|---|---|---|
| Examp. I | 900 | 370 | 0.7 | 1.6 | 4,500 |
| Examp. II | 740 | 395 | 0.6 | 1.3 | 4,570 |
| Examp. III | 720 | 395 | 0.7 | 1.3 | 4,990 |
| C. Examp. I | 930 | 370 | 1.1 | 1.4 | 3,200 |
| C. Examp. II | 310 | 390 | 0.6 | 1.2 | 4,660 |

Taken together, the data demonstrate that the adhesive tapes prepared in Examples according to the present invention are excellent in all of the properties tested while the conventional adhesive tapes prepared in Comparative Examples are poor in specific properties. For example, the adhesive tape of Comparative Example I has a disadvantage of generating a large quantity of out gas and of being low in modulus of elasticity. For Comparative Example II, the adhesiveness is particularly poor.

As described hereinbefore, the adhesive tape prepared according to the present invention is superior in physical properties, including adhesiveness, thermal resistance and the like, and in electrical properties, so that it is very useful for electronic parts, such as semiconductor devices.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

We claim:

1. A method for producing an adhesive tape, in which an adhesive composition comprising a carboxylic group-containing acrylonitrile-butadiene copolymer ranging, in weight average molecular weight, from 5,000 to 10,000 with an acrylonitrile content of 5–50 weight %, a mixed epoxy resin selected from a set of bisphenol A-type epoxy and cresol novolak epoxy and a set of bisphenol A-type epoxy and phenol novolak epoxy, a compound having at least two intramolecular maleimide groups, an aromatic diamine compound, an epoxy-containing liquid silicon resin, a filler and a solvent, is coated on one side or both sides of a thermal resistant film and dried.

2. The method as set forth in claim 1, wherein the acrylonitrile-butadiene copolymer ranges, in carboxyl equivalent, from 500 to 10,000.

3. The method as set forth in claim 1, wherein the bisphenol A-type epoxy is used at an amount of 20–50 weight parts and the cresol novolak epoxy and phenol novolak epoxy are used at an amount of 10–200 weight parts, based on 100 weight parts of the acrylonitrile-butadiene copolymer.

4. The method as set forth in claim 1, wherein the compound having at least two intramolecular maleimide groups are used at an amount of 10–200 weight parts based on 100 weight parts of the acrylonitrile-butadiene copolymer.

5. The method as set forth in claim 1, wherein the compound having at least two intramolecular maleimide groups is represented by the following chemical formula I or II:

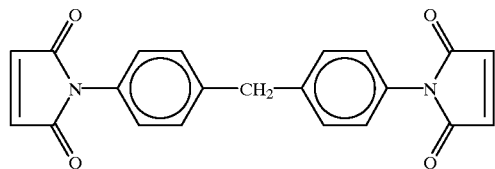

[I]

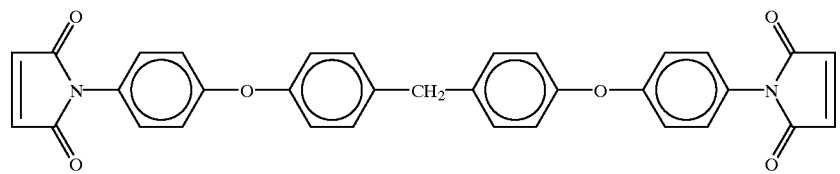

[II]

6. The method as set forth in claim 1, wherein the aromatic diamine compound is used at an amount of 1–100 weight parts based on 100 weight parts of the sum of the mixed epoxy resin and the compound having at least two intramolecular maleimide groups.

7. The method as set forth in claim 1, wherein the epoxy-containing liquid silicon resin is used at an amount of 0.1–20 weight parts based on 100 weight parts of the acrylonitrile-butadiene copolymer.

* * * * *